(12) United States Patent
Sung et al.

(10) Patent No.: US 7,994,712 B2
(45) Date of Patent: Aug. 9, 2011

(54) ORGANIC LIGHT EMITTING DISPLAY DEVICE HAVING ONE OR MORE COLOR PRESENTING PIXELS EACH WITH SPACED APART COLOR CHARACTERISTICS

(75) Inventors: Un-Cheol Sung, Anyang-si (KR);
Ji-Hye Choi, Suwon-si (KR);
Young-Rok Song, Yongin-si (KR);
Soo-Yeon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 12/331,821

(22) Filed: Dec. 10, 2008

(65) Prior Publication Data
US 2009/0261715 A1 Oct. 22, 2009

(30) Foreign Application Priority Data
Apr. 22, 2008 (KR) .................. 10-2008-0037339

(51) Int. Cl.
*H01J 1/62* (2006.01)
*H05B 33/00* (2006.01)
*G09G 3/30* (2006.01)

(52) U.S. Cl. .............. 313/506; 315/169.4; 313/504; 313/505; 313/507; 313/508; 313/509; 313/510; 313/511; 313/512; 445/24; 445/25

(58) Field of Classification Search .......... 313/501–512; 315/169.4; 445/24–25
See application file for complete search history.

(56) References Cited

U.S. PATENT DOCUMENTS
2005/0225232 A1* 10/2005 Boroson et al. .............. 313/504
2007/0222800 A1* 9/2007 Fish et al. .................... 345/694
* cited by examiner Primary Examiner — Anne M Hines
Assistant Examiner — Tracie Green
(74) Attorney, Agent, or Firm — Innovation Counsel LLP

(57) ABSTRACT

An organic light emitting device includes a first pixel displaying a first color, a second pixel adjacent to the first pixel and displaying a second color, and a third pixel adjacent to the first pixel or the second pixel and displaying a third color, wherein the first pixel includes a first and second subpixel units that output respective lights having different color characteristics.

19 Claims, 9 Drawing Sheets

ORGANIC LIGHT EMITTING DISPLAY DEVICE HAVING ONE OR MORE COLOR PRESENTING PIXELS EACH WITH SPACED APART COLOR CHARACTERISTICS

CROSS-REFERENCE TO RELATED APPLICATION

This application claims priority to and benefit of Korean Patent Application No. 10-2008-0037339 filed in the Korean Intellectual Property Office on Apr. 22, 2008, the entire contents of which application are incorporated herein by reference.

BACKGROUND (a) Field of Invention

The present disclosure of invention relates to an organic light emitting device (OLED).

(b) Description of Related Technology

An organic light emitting device (OLED) typically includes a plurality of pixel units, and each pixel unit includes an organic light emitting element and a plurality of thin film transistors (TFT's) for driving the same.

The typical organic light emitting element includes an anode, a cathode, and an organic light emitting member disposed therebetween. The composition of each organic light emitting member is such that when activated it emits light corresponding to one of three colors such as the three primary colors red, green, and blue, or it emits white light. The material used for each organic light emitting member depends on the color or white light that the given organic light emitting member is intended to emits. A white light can be generated for example by stacking side-by-side or otherwise light emitting materials that emit red, green, and blue so that the synthesized light appears white. Moreover, in the case where the organic light emitting member emits white light, a color filter may be added over it to obtain light of a desired color.

However, light emitted from the respective pixel units may not have desired optical characteristics such as desired wavelength(s) or bandwidth or color purity due to variations in the material characteristics of the organic light emitting element and/or due to light interference by a thin film through which the unit generated light passes. Moreover, the range that can be displayed by the light may be limited.

SUMMARY

The present disclosure of invention provides an organic light emitting device of improved characteristics. An exemplary organic light emitting device in accordance with the disclosure includes a first pixel displaying a first color, a second pixel adjacent to the first pixel and displaying a second color, and a third pixel adjacent to the first pixel or the second pixel and displaying a third color, wherein the first pixel includes a first subpixel unit and a second subpixel unit emitting lights having different color characteristics.

The different color characteristics define substantially spaced apart color coordinates on a gamut map associated with the organic light emitting device such that the human eye perceives an expanded range of colors.

The first and second subpixel units may each have a multi-layered thin film structure, but the number of thin films in the first subpixel unit may be greater than that of the second subpixel thus providing substantially different processing of pre-emission light in the first subpixel unit and resulting in a substantially different output spectrum. In one embodiment, the first subpixel unit has a transflective electrode whereas the second subpixel unit does not. In one embodiment, the independently controllable first and second subpixel units are provided in the green light emitting area of a repeated RGB light producing structure.

The second pixel (e.g., Red) may have a multi-layered thin film structure including a second transflective electrode, and the third pixel (e.g., Blue) may have a multi-layered thin film structure including a third transflective electrode. The number of thin films in of each of the second and third pixel s may be the same as that of the first subpixel unit in the first pixel area (e.g., Green).

In the same or an alternate embodiment, the second pixel area may include third and fourth subpixel units emitting lights having respectively different color characteristics defined as spaced apart color coordinates on a color gamut map. The third and fourth subpixel units may have multi-layered thin film structures, where the number of thin films in the third subpixel unit may be the same as that for the first subpixel unit, and where the number of thin films in the fourth subpixel unit may be the same as that for the second subpixel unit. In one embodiment, the third subpixel unit includes a second transflective electrode.

The third pixel may have a multi-layered thin film structure including the third transflective electrode, and the number of thin films of the third pixel may be the same as that of the thin films of the first and third subpixel units. The first color may be red, the second color may be blue, and the third color may be green.

In the same or an alternate embodiment, the third pixel may include fifth and sixth subpixel units respectively emitting light having different color characteristics defined as spaced apart color coordinates on the color gamut map. The fifth and sixth subpixel units may each have a multi-layered thin film structure, where the number of thin films in the fifth subpixel unit may be the same as that of the first and third subpixels units, and where the number of thin films in the sixth subpixel unit may be the same as that of the second and fourth subpixel units. The fifth subpixel unit may include a third transflective electrode An organic light emitting device in accordance with the disclosure may include: a thin film structure (e.g., TFT's) formed on a transparent substrate; first, second, and third transflective electrodes formed on the thin film structure; a first transparent electrode formed on the first transflective electrode; a second transparent electrode formed directly on the thin film structure and having a same drive voltage as applied to the first transparent electrode; a third transparent electrode formed on the second transflective electrode; a fourth transparent electrode formed on the third transflective electrode; a first organic light emitting member formed on the first transparent electrode and displaying a first color; a second organic light emitting member formed on the second transparent electrode and displaying the first color; a third organic light emitting member formed on the third transparent electrode and displaying a second color; a fourth organic light emitting member formed on the fourth transparent electrode and displaying a third color; and a common electrode formed on the first to fourth organic light emitting members.

The first color may be green, the second color may be red, and the third color may be blue.

The organic light emitting device may further include a fifth transparent electrode formed directly on the thin film structure and having a same drive voltage the third transparent electrode, and a fifth organic light emitting member formed on the fifth transparent electrode and displaying the second color. The first color may be red, the second color may be blue, and the third color may be green.

The organic light emitting device may further include a sixth transparent electrode formed directly on the thin film structure and having a same drive voltage as the fourth transparent electrode, and a sixth organic light emitting member formed on the sixth transparent electrode and displaying the third color.

DETAILED DESCRIPTION

Figure 1A:
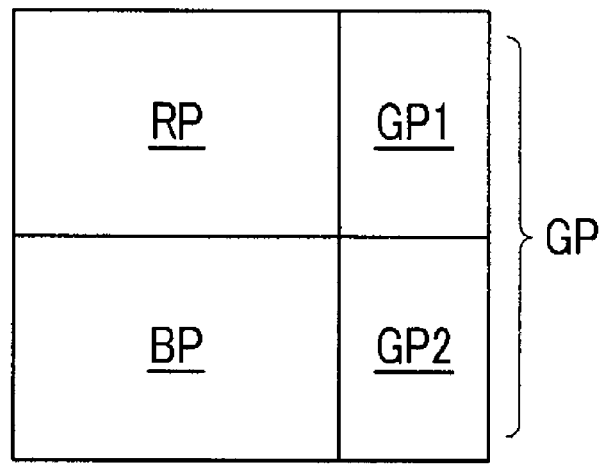
FIGS. 1A and 1B are drawings showing respective possible pixel area and subpixel arrangements for an organic light emitting device in accordance with an exemplary first embodiment.

The present disclosure of invention is described more fully hereinafter with reference to the accompanying drawings, in which exemplary embodiments are shown.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an organic light emitting device in accordance with an exemplary first embodiment will be described in detail with reference to FIGS. 1 to 5 below.

Figure 1B:
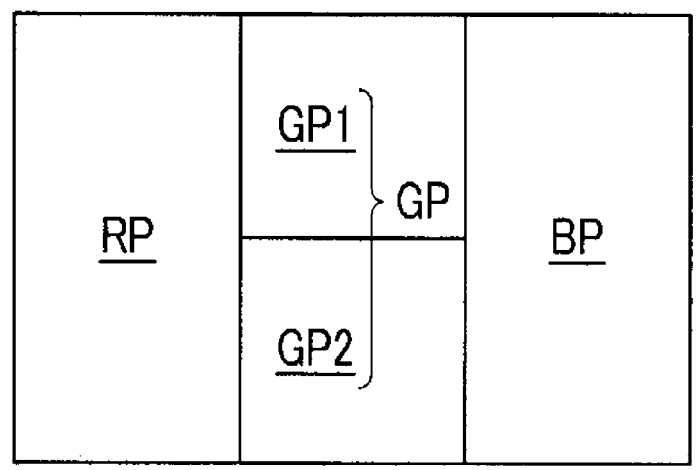
Figure 2:
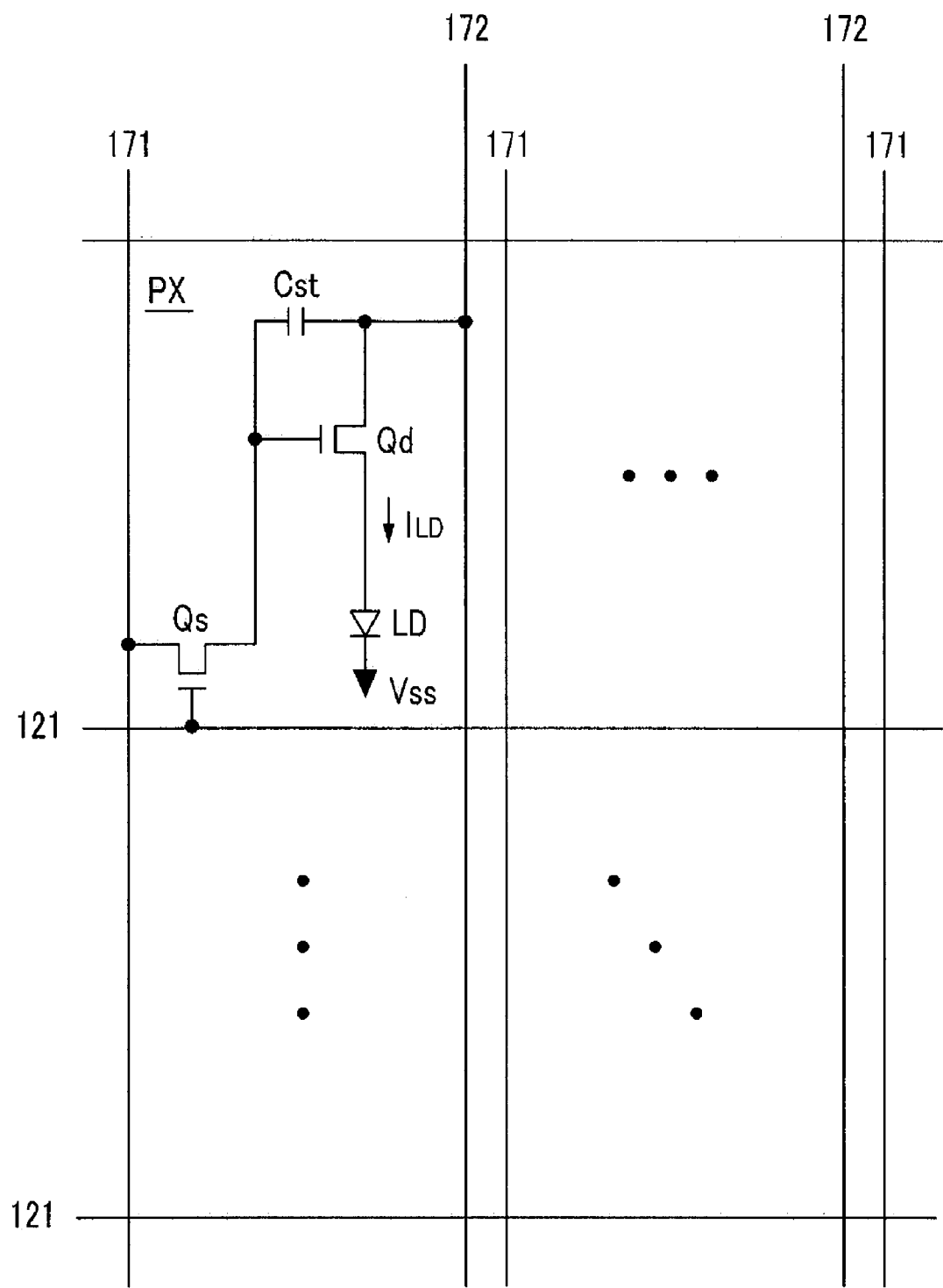
FIG. 2 is an equivalent circuit diagram of the organic light emitting device of FIGS. 1A and 1B.
Figure 3:
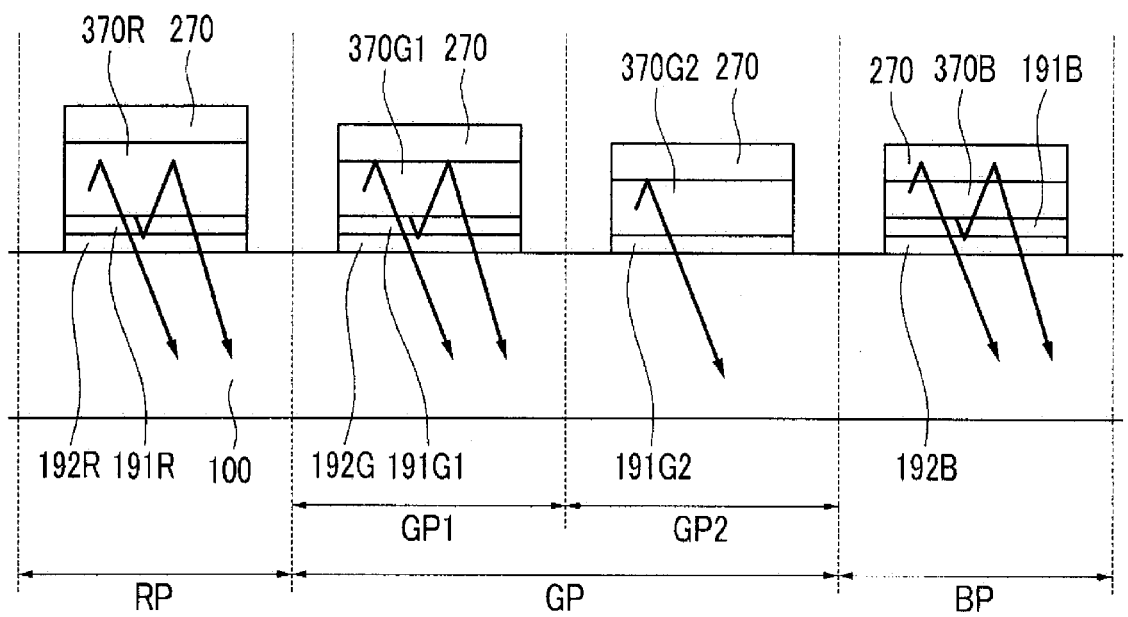
FIG. 3 is a cross-sectional view schematically showing the organic light emitting device of FIGS. 1A and 1B including the multilayer thin film structures.
Figure 4:
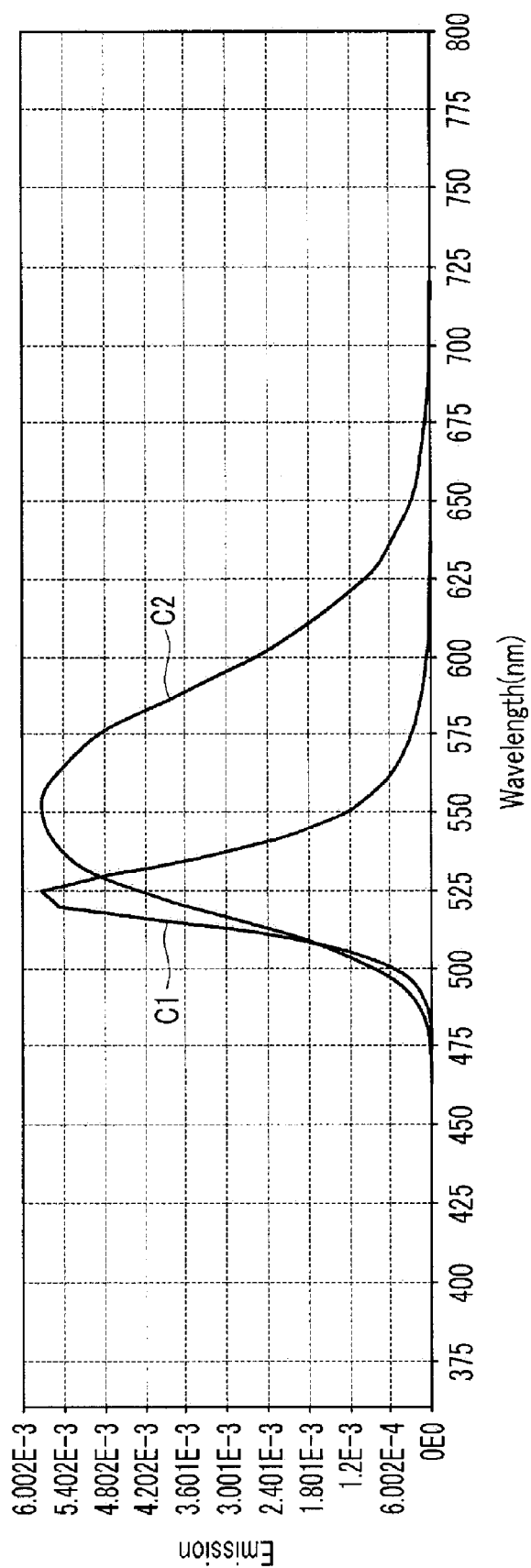
FIG. 4 is a spectral graph showing light intensity of the two subpixel units of FIG. 3.
Figure 5:
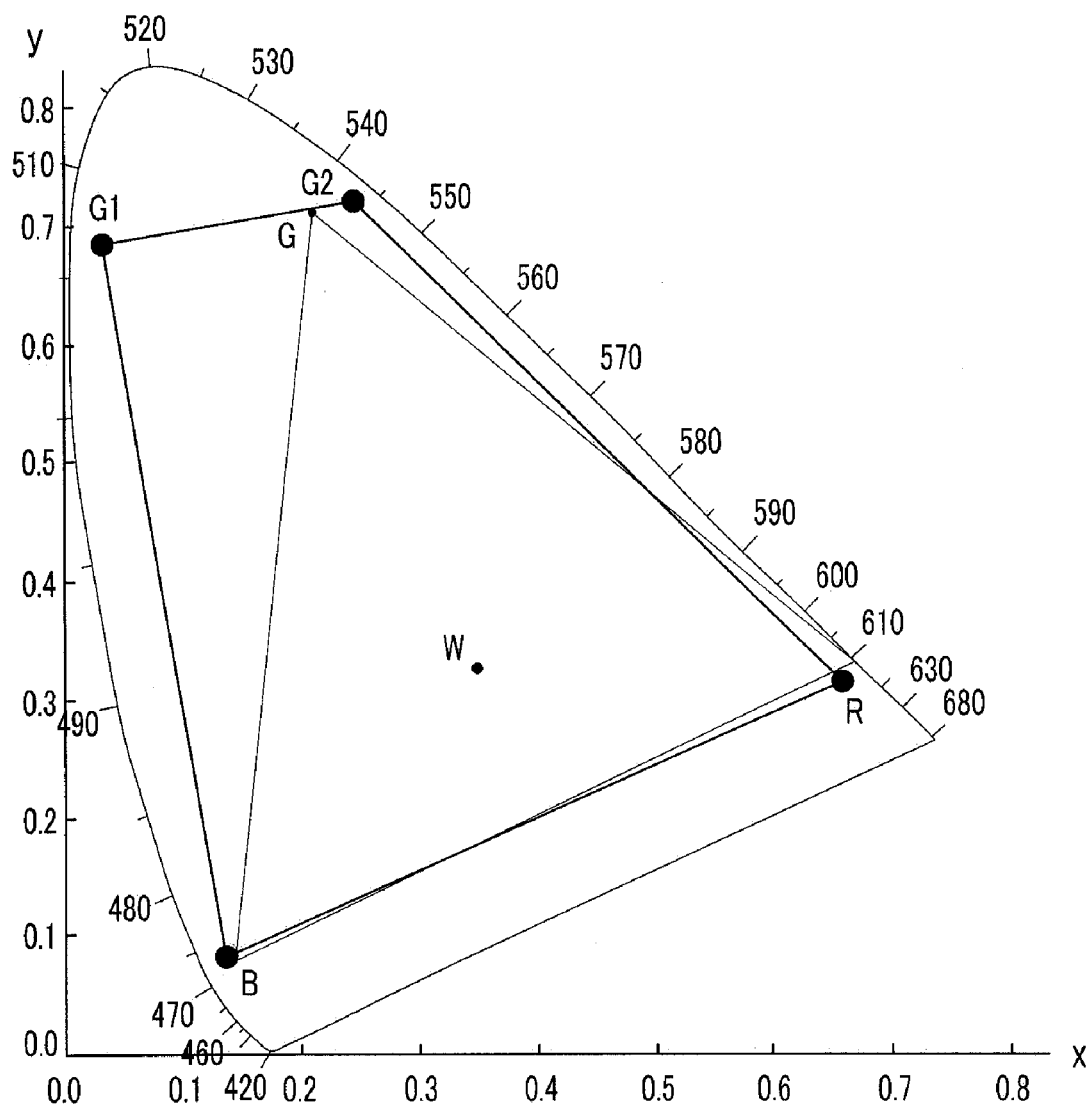
FIG. 5 is a graph showing a range of colors (gamut map) that the organic light emitting device of FIG. 3 can display.

FIGS. 1A and 1B show possible pixel and subpixel arrangements of organic light emitting devices in accordance with exemplary embodiments. FIG. 2 is an equivalent circuit diagram of the organic light emitting devices shown in FIGS. 1A and 1B. FIG. 3 is a schematic cross-sectional view of the organic light emitting device shown in FIGS. 1A and 1B. FIG. 4 is a graph showing light intensity of two subpixels shown in FIG. 3. FIG. 5 is a graph showing a range (gamut) of colors that the organic light emitting device shown in FIG. 3 can selectively emit.

As shown in FIGS. 1A and 1B, an organic light emitting device in accordance with the first exemplary embodiment includes a red pixel RP, a green pixel GP, and a blue pixel BP. The green pixel GP includes two subpixels GP1 and GP2 having different color characteristics. (See briefly FIG. 4.)

For example, color coordinates in a gamut map of the greens that the two subpixels GP1 and GP2 respectively produce may be different from each other.

In the pixel and subpixel arrangement shown in FIG. 1A, the red pixel RP and the blue pixel BP, which have rectangular light emitting areas with a width to length ratio of about 4:3, are aligned one above the other (and this pattern continues up and down the display panel column) while the two subpixels GP1 and GP2 of the green pixel GP have rectangular light emitting areas each with a width (X) to height (Y) ratio of about 2:3, where the heights of the two subpixels GP1 and GP2 respectively match the heights on the right sides (or alternatively left sides) respectively of the green pixel RP and the blue pixel BP positioned next to them. The total light emitting area of the two subpixels GP1 and GP2 may be substantially the same as that of each of the red pixel RP and the blue pixel BP.

In the pixel arrangement shown in FIG. 1B, the red pixel RP, the green pixel GP, and the blue pixel BP, which are rectangles each with a width to length ratio of about 1:3, are arranged horizontally in a row. The two equally-sized subpixels GP1 and GP2 of the green pixel GP subdivide the GP areas in half and are arranged one above the other as shown (or alternatively in a reversed up/down order).

There may be various arrangements other than those shown in FIGS. 1A and 1B that provide similar effects and these are to be deemed within the scope of the present disclosure.

Each of the red pixel RP, the blue pixel BP, and the subpixels GP1 and GP2 of the green pixel GP may be independently activated by a respective data capture and LD driving circuit such as the one shown in FIG. 2.

Referring to FIG. 2, each pixel unit PX (or subpixel unit) is respectively connected to respective signal lines such as the illustrated 121, 171, and 172.

The signal lines includes a plurality of horizontal gate lines 121 for transmitting gate signals (or data capture scanning signals), a plurality of vertical data lines 171 for transmitting analog data signals, and a plurality of vertical driving voltage lines 172 for supplying driving voltages. The gate lines 121 extend substantially in a row direction and are substantially parallel to each other, and the data lines 171 extend substantially in a column direction and are substantially parallel to each other. Although the driving voltage lines 172 are shown as extending substantially in a column direction, they may extend in a row direction or in a column direction, or may be formed in a matrix or as an underlying circuit plane.

Each pixel or subpixel unit PX includes a switching transistor Qs, a driving transistor Qd, a storage capacitor Cst, and an organic light emitting element represented schematically as diode LD.

The switching transistor Qs includes a control terminal, an input terminal, and an output terminal, in which the control terminal is connected to a gate line 121, the input terminal is connected to a data line 171, and the output terminal is connected to the driving transistor Qd. The switching transistor Qs transmits a data signal sampled off from the data line 171 to the driving transistor Qd in response to an active scanning signal (e.g., pulse) received from the gate line 121.

The driving transistor Qd also includes a control terminal, an input terminal, and an output terminal, in which the control terminal is connected to the switching transistor Qs and to a charge storage capacitor Cst, the input terminal is connected to a driving voltage line 172 (and to an opposed terminal of the charge storage capacitor Cst), and the output terminal is connected to the organic light emitting element LD. The driving transistor Qd applies an output current $I_{LD}$ having a magnitude that varies according to a voltage difference between the control terminal and the output terminal as stored on the storage capacitor Cst. The storage capacitor Cst which is connected between the control terminal and the input terminal of the driving transistor Qd stores the data signal applied to the control terminal of the driving transistor Qd and maintains the stored data signal even after the switching transistor Qs is turned off.

The organic light emitting element LD, which is an organic light emitting diode (OLED), for example, has an anode connected to the output terminal of the driving transistor Qd and a cathode connected to a common voltage Vss. The organic light emitting element LD emits light having an intensity that depends on an output current $I_{LD}$ of the driving transistor Qd, to thereby display a corresponding pixel of an image.

In one embodiment, the switching transistor Qs and the driving transistor Qd are n-channel field effect transistors (FET); however, at least one of the switching transistor Qs and the driving transistor Qd may be a p-channel FET instead. Moreover, the connection relationship among the transistors Qs and Qd, the storage capacitor Cst, and the organic light emitting element LD may be changed to provide similar functions but with different circuit arrangements depending on the types of transistors used.

If necessary, additional transistors (not shown) for compensating for threshold voltages of the driving transistor Qd and the organic light emitting element LD may be further provided in each pixel unit PX in addition to the switching transistor Qs and the driving transistor Qd.

The respective switching transistors Qs of the two subpixels GP1 and GP2 of the green pixel GP may be connected to a same gate line 121 and to a same data line 171, and/or the two subpixels GP1 and GP2 of the green pixel GP may share at least one of the switching transistor Q2 and the driving transistor Qd. Otherwise, the switching transistors Qs of the two subpixels GP1 and GP2 of the green pixel GP may be connected to different data lines 171 to thereby receive independent data signals or to different gate lines 121 to thereby be activated to capture respective data signals at different times. In this case, the respective luminance output by each of the two subpixels GP1 and GP2 is independently determined and a synthesized joint luminance of the two subpixels GP1 and GP2 may be made substantially equal to a target luminance within a gamut (see briefly FIG. 5) which includes the maximum outputs of subpixels GP1 and GP2 as corner points.

Moreover, when it comes to commonly used organic light emitting materials, the green pixel GP often has higher electric-to-apparent luminosity conversion efficiency than the red pixel RP and the blue pixel BP. Accordingly, when a greater number of the two subpixels GP1 and GP2 of the green pixel GP are used than that of the red pixel RP and the blue pixel BP, it is possible to more efficiently improve the apparent luminosity and/or chrominance perceived by a human eye for given image data for the respective pixels RP, GP, and BP. Thus there is an advantage to bifurcating the green pixel GP into independently controllable subpixels GP1 and GP2 having differing emission spectra (see briefly FIG. 4).

Next, the cross-sectional structure of the organic light emitting element LD of each of the pixels RP, GP, and BP shown in FIGS. 1A and 1B will be described with reference to FIG. 3.

In FIG. 3, R and B are added as suffixes to the reference numerals related to the red pixel (RP) and to the reference numerals related to the blue pixel (BP), respectively. G1 and G2 are added as suffixes to the reference numerals related to the first subpixel G1 and the second subpixel G2 of the green pixel GP, respectively.

The organic light emitting device in accordance with the present exemplary embodiment is provided in the form of a thin film on an insulation substrate made of transparent glass or plastic. The signal lines 121, 171, and 172 and the transistors Qs and Qd (not shown in FIG. 3) are disposed below the organic light emitting element LD and may be covered by a passivation layer (not shown). In this way, the signal lines 121, 171 and 172, the transistors Qs and Qd, and the passivation layer on the substrate will be referred to as a thin film structure 100 underlying the four OLED regions shown distinctly in FIG. 3.

A plurality of three transflective electrodes 192R, 192G, and 192B are formed on the thin film structure 100. The second subpixel GP2 of the green pixel GP does not include such a transflective electrode or its optical equivalent (e.g., two thinner and spaced apart transflective electrical conductors).

The transflective electrodes 192R, 192G, and 192B may be made of a metal having high reflectance such as silver (Ag) or aluminum (Al), and may have a thickness of about 150 Å to 200 Å. In this way, when the thickness is small even if it is metal, the metal has transflective characteristics in which some incident light may be reflected and some may be transmitted through.

A plurality of four pixel electrodes 191R, 191G1, 191G2, and 191B are respectively formed as shown over the areas of the three transflective electrodes 192R, 192G, and 192B and over the GP2 area of the thin film structure 100. Since the second subpixel GP2 of the green pixel GP does not include a transflective electrode, the pixel electrode 191G2 is positioned directly on the thin film structure 100 in the corresponding region to be in contact with the thin film structure 100.

The pixel electrodes 191R, 191G1, 191G2, and 191B may be made of a transparent conductive material such as ITO or IZO, and may have a thickness of about 300 Å to 3000 Å. The pixel electrodes 191R, 191G1, 191G2, and 191B may be connected to the driving transistor through a contact hole (not shown) formed on the passivation layer of the thin film structure 100.

Organic light emitting members 370R, 370G1, 370G2, and 370B are formed on the pixel electrodes 191R, 191G1, 191G2, and 191B. The organic light emitting members 370R, 370G1, 370G2, and 370B emit light of colors corresponding to the respective pixels RP, GP, and BP, in which the organic light emitting members 370G1 and 370G2 of the first subpixel GP1 and the second subpixel GP2 of the green pixel GP may be made in one embodiment, of the same material with the same thickness and thus originally emit green light having the same color characteristics. The thicknesses of the organic light emitting members 370R, 370G1, 370G2, and 370B may vary according to the pixels RP, GP, and BP, and the thickness may be reduced in the order of the red pixel RP, the green pixel GP, and the blue pixel BP. Otherwise, the organic light emitting members 370R, 370G1, 370G2, and 370B may have the same thickness.

Each of the organic light emitting members 370R, 370G1, 370G2, and 370B may have a multi-layered structure including a light emission layer (not shown) for emitting light and an auxiliary layer (not shown) for improving the light emitting efficiency of the light emission layer. The auxiliary layer may include an electron transport layer (not shown) and a hole transport layer (not shown) that achieve a balance of electrons and holes, and an electron injecting layer (not shown) and a hole injecting layer (not shown) that improve the injection of electrons and holes. The thicknesses of the organic light emitting members 370R, 370G1, 370G2, and 370B may be adjusted according to the thickness of the respective hole transport layer.

A common electrode 270 for applying the common voltage VSS is formed on the organic light emitting members 370R, 370G1, 370G2, and 370B. Although FIG. 3 shows that the common electrodes 270 are all separated from the pixels RP and BP and the subpixels GP1, they may be all connected thereto, which is to simplify the process. The common electrode 270 may be made of a reflective metal including calcium (Ca), barium (Ba), magnesium (Mg), aluminum (Al), silver (Ag), etc.

In the above-described organic light emitting device, the three transflective electrodes 192R, 192G, and 192B, the four pixel electrodes 191R, 191G1, 191G2, and 191B, as well as the four organic light emitting members 370R, 370G1, 370G2, and 370B, and the common electrode 270 form a corresponding four organic light emitting elements LD, in which the pixel electrodes 191R, 191G1, 191G2, and 191B define the anode and the common electrode 270 defines the cathode.

The organic light emitting device emits light toward the bottom of the substrate 100 to display an image. In the case of the red pixel RP, the first subpixel GP1 of the green pixel GP, and the blue pixel BP, light emitted from the organic light emitting members 370R, 370G1, and 370B to the thin film structure 100 passes through the pixel electrodes 191R, 191G1, and 191B and then it reaches the transflective electrodes 192R, 192G, and 192B. The transflective electrodes 192R, 192G, and 192B partially reflect the incident light toward the common electrode 270, and the common electrode 270 reflects the partially reflected light back towards the transflective electrodes 192R, 192G, and 192B. In this way, light reciprocating between the transflective electrode 192 and the common electrode 270 is subjected to an optical process such as interference before it is output through the transflective electrodes 192R, 192G, and 192B to the outside if appropriate conditions are imposed.

In this case, since the light path varies according to the thicknesses of thin films interposed between the transflective electrodes 192R, 192G, and 192B and the common electrode 270, it is possible to obtain different light emissions having desired optical characteristics such as broad or narrow ranges of wavelengths of desired bandwidths and spectral shapes and color purity or nonpurity, if the thicknesses of the thin films are appropriately selected. For example, as described above, it is possible to obtain light having a desired one or more wavelengths by varying the thicknesses of the organic light emitting members 370R, 370G1, and 370B according to the pixels or subpixels in which they reside.

However, if the thickness of the transflective electrodes 192 is too large, the luminance of emitted light may be reduced, whereas if it is too small, it may difficult if not impossible to obtain the desired optical characteristics. Accordingly, in one embodiment, the thicknesses of the transflective electrodes 192 is in the range of about 150 Å to about 200 Å as described above.

Meanwhile, since the second subpixel GP2 of the green pixel GP does not include a transflective electrode 192, light emitted from its organic light emitting member 370G2 is directly emitted to the outside whereas light emitted from the organic light emitting members 370R, 370G1, and 370B is both directly emitted to the outside and reflectively bounced back and forth between the transflective electrode 192 and the common electrode 270 and then emitted to the outside. Thus for the second subpixel GP2 the latter particular optical interference does not occur whereas of the first subpixel GP1 as well as for pixels RP and BP it does to one extent or another depending on specifics of the utilized layer thicknesses.

In this way, the color characteristics of light emitted from the first subpixel GP1 and the second subpixel GP2 of the green pixel GP may be caused to be different.

FIG. 4 shows for one embodiment, how the intensity and spectra of light emitted from the first subpixel GP1 and the second subpixel GP2 may be made to vary. Light C1 emitted from the first subpixel GP1 shows a sharp peak in the vicinity of green (around 525 nm), whereas light C2 emitted from the second subpixel GP2 may be made to show a relatively flat peak plateau around 550 nm for example and a sharp rise at the wavelength corresponding to the peak of the GP1 light C1.

FIG. 5 is a graph (gamut map) showing a range of colors that the red pixel RP, the blue pixel BP, and the two subpixels GP1 and GP2 of the green pixel GP in the organic light emitting device can display, which shows color coordinates on the Commission Internationale de l'Eclairage (CIE) 1931 chromaticity diagram.

In FIG. 5, R, B, G1, and G2 are examples of corner color coordinates for the maximum luminosity outputs of light emitted respectively by the red pixel RP, the blue pixel BP, and the two subpixels GP1 and GP2 of the green pixel GP, respectively. In FIG. 5, G represents is an example of what the color corner coordinate would have been if the green pixel GP had not been divided into two independently driven and differently outputting subpixels. W is a color coordinate point of white.

If the green pixel GP had not been divided into two independent subpixels, then it would be possible to display only the various colors bounded within the triangle defined by the color corner coordinates of R, G, and B. However, when the green pixel GP is divided into two independently controllable subpixels GP1 and GP2 in accordance with the present exemplary embodiment, it is possible to display colors within a quadrilateral area defined by the color coordinates of R, G1, G2, and B, and thus the range of colors (the available gamut) that can be displayed is increased by about 40%.

Since the range of colors that can be displayed in the present exemplary embodiment is increased relative to the conventional tri-color RGB-only configuration, it is possible to obtain colors within a broader range (inside the R-G1-G2-B gamut) even if the organic light emitting members 370R, 370G1, 370G2, and 370B are formed with a same thickness for process convenience and even though the organic light emitting materials of G1 and G2 are the same (again for process convenience).

Next, an organic light emitting device in accordance with another exemplary embodiment will be described in detail with reference to FIGS. 6 to FIG. 8.

Figure 6:
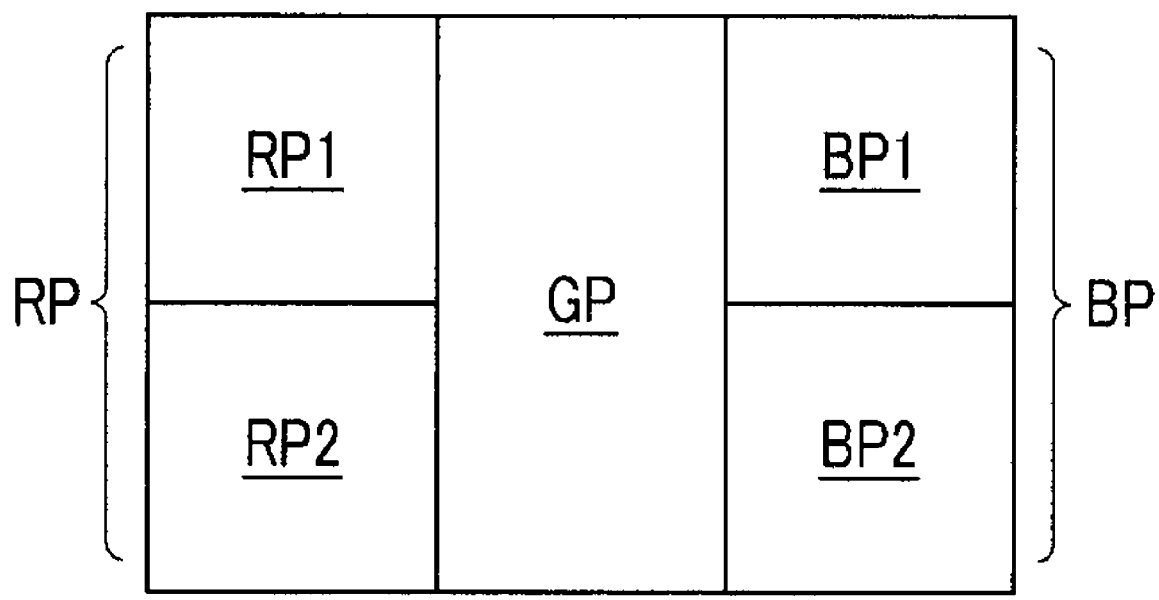
FIG. 6 is a drawing showing a pixel arrangement of an organic light emitting device in accordance with another exemplary embodiment.

FIG. 6 is a drawing showing a five pixels/subpixels arrangement (R1/R2,G,B1/B2) of an organic light emitting device in accordance with the second exemplary embodiment. FIG. 7 is a cross-sectional view schematically showing the organic light emitting device of FIG. 6, and FIG. 8 is a graph showing a range of colors (gamut map) that the organic light emitting device of FIG. 7 can display.

As shown in FIG. 6, the organic light emitting device in accordance with the R1/R2,G,B1/B2 embodiment includes a red pixel area RP, a green pixel area GP, and a blue pixel area BP. Each of the red pixel area RP and the blue pixel area BP includes two independently controllable subpixel units, RP1 and RP2, and BP1 and BP2, respectively, which have different color characteristics. For example, color coordinates in the gamut map (FIG. 8) of red that the two red subpixel units RP1 and RP2 display may be different from each other, and color coordinates in the gamut map of blue that the two blue subpixels BP1 and BP2 display may be different from each other.

In the pixel arrangement shown in FIG. 6, the red pixel area RP, the green pixel area GP, and the blue pixel area BP, are each a rectangle with a width to length ratio of about 1:3, and they are arranged horizontally in a row as shown. (In an alternate embodiments, the pixel arrangement can be rotated as desired, including to a 90° rotation.) The subpixels RP1, RP2, BP1, and BP2 of the respective red pixel area RP and the blue pixel area BP have the same size and are arranged up and down.

There may be various arrangements other than that shown in FIG. 6.

Next, the cross-sectional structure of the organic light emitting elements (LD's) of each of the pixels RP, GP, and BP as shown in FIG. 6 will be described with reference to FIG. 7.

Figure 7:
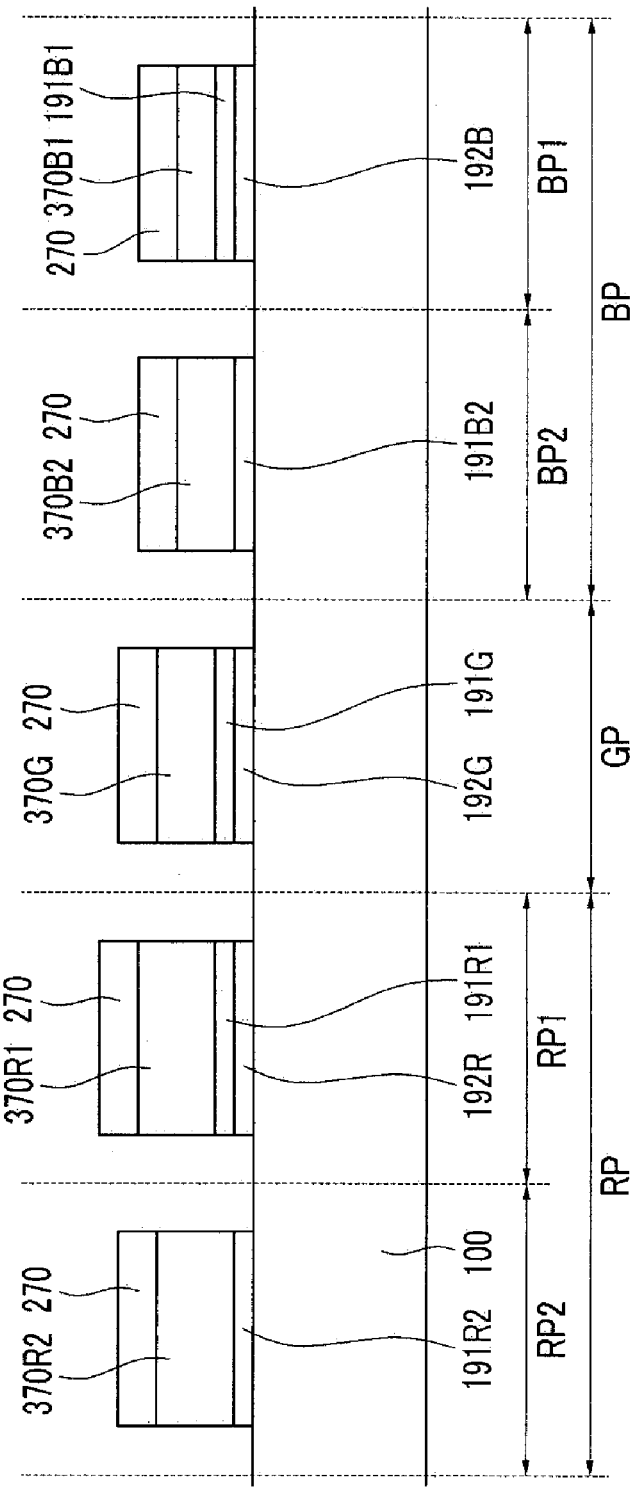
FIG. 7 is a cross-sectional view schematically showing the organic light emitting device of FIG. 6.

In FIG. 7, G is added as a suffix to the reference numerals related to the green pixel area GP. R1 and R2 are added to the reference numerals related to the first subpixel RP1 and the second subpixel RP2 of the red pixel area RP, respectively, and B1 and B2 are added to the reference numerals related to the first subpixel BP1 and the second subpixel BP2 of the blue pixel area BP, respectively.

The cross-sectional structure of the organic light emitting device in accordance with the present exemplary embodiment is generally similar to that of FIG. 3. That is, the red pixel area RP and the blue pixel area BP are each divided into two independently controllable subpixel units RP1 and RP2, and BP1 and BP2, respectively, and the green pixel unit GP is not divided into two subpixels. However, the basic structures and operations of the respective pixels RP, GP, and BP are substantially the same.

In more detail, a plurality of transflective electrode 192R, 192G, and 192B are formed on a thin film structure 100 of FIG. 7 in the areas shown. The second subpixel unit RP2 of the red pixel area RP and the second subpixel unit BP2 of the blue pixel area BP do not include a transflective electrode and thus their light emission spectra are different from those of corresponding units RP1 and BP1.

A plurality of pixel electrodes 191R1, 191R2, 191G, 191B1, and 191B2 are formed on the transflective electrodes 192R, 192G, and 192B and directly on the thin film structure 100 in the respective areas as shown. Since the second subpixel unit RP2 of the red pixel area RP and the second subpixel unit BP2 of the blue pixel area BP do not include a transflective electrode, the pixel electrodes 191R2 and 191B2 are positioned directly on the thin film structure 100 in the corresponding region to be in contact with the thin film structure 100.

Organic light emitting members 370R1, 370R2, 370G, 370B1, and 370B2 are formed on the pixel electrodes 191R1, 191R2, 191G, 191B1, and 191B2, and a common electrode 270 is formed thereon.

Figure 8:
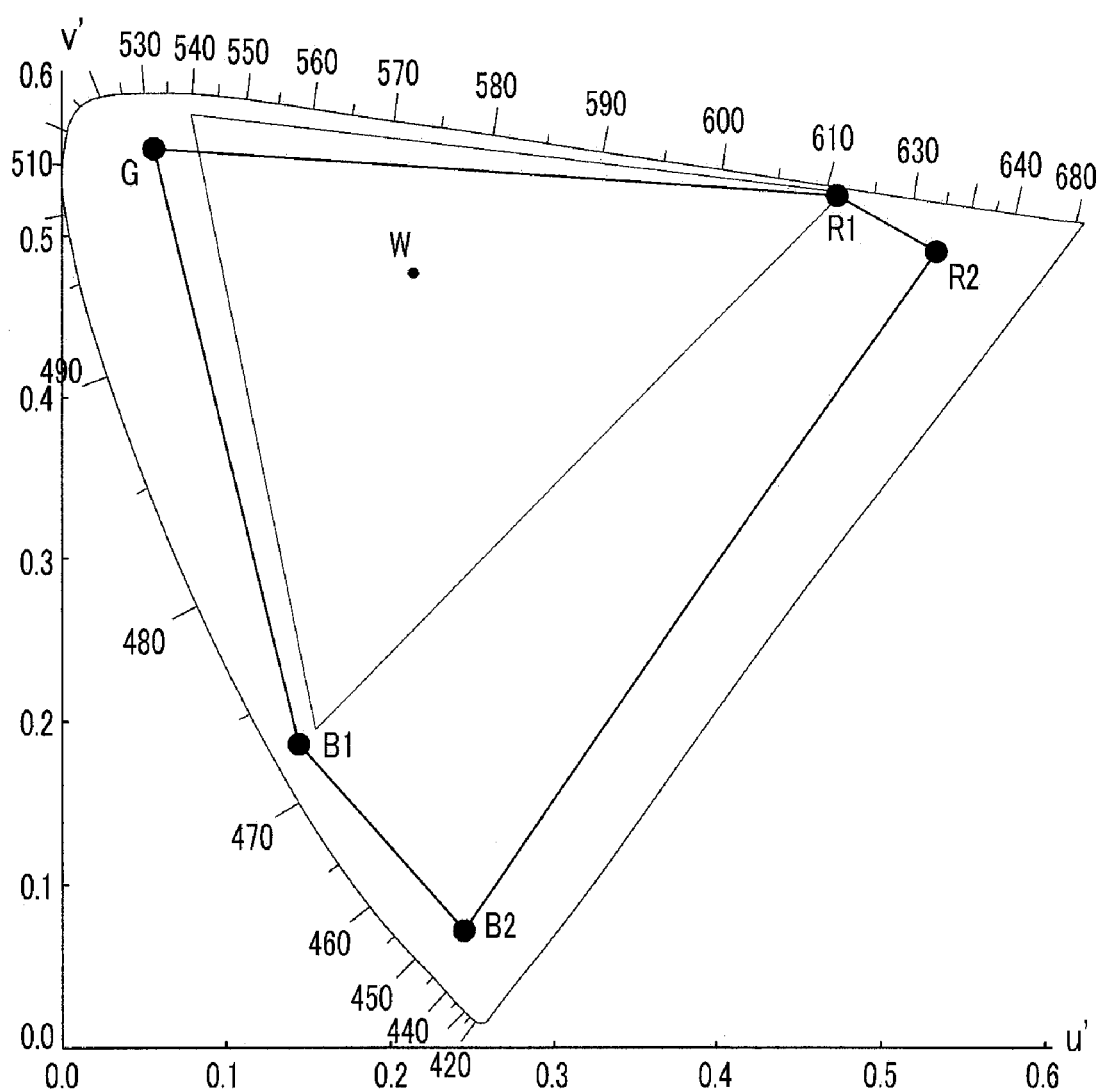
FIG. 8 is a gamut map showing a range of colors that the organic light emitting device of FIG. 7 can display.

The organic light emitting device shown in FIGS. 6 and 7 may display colors within a range (gamut map) shown in FIG. 8. FIG. 8 is a graph showing a range of colors that the two subpixels RP1 and RP2 of the red pixel RP, the two subpixels BP1 and BP2 of the blue pixel BP, and the green pixel GP can display, which shows color coordinates on the CIE 1976 chromaticity diagram.

In FIG. 8, colors that the organic light emitting device in accordance with the present exemplary embodiment can display are within a pentagon defined by the color coordinates of R1, R2, G, B1, and B. The area of this pentagon may represent an increase of as much as about 70% over that of the conventional RGB triangle. Thus, by using the configuration of FIG. 8 or similar pentagon configurations in accordance with its spirit, designers can display a wider gamut of colors.

Finally, an organic light emitting device in accordance with yet another exemplary embodiment will be described in detail with reference to FIG. 9.

Figure 9:
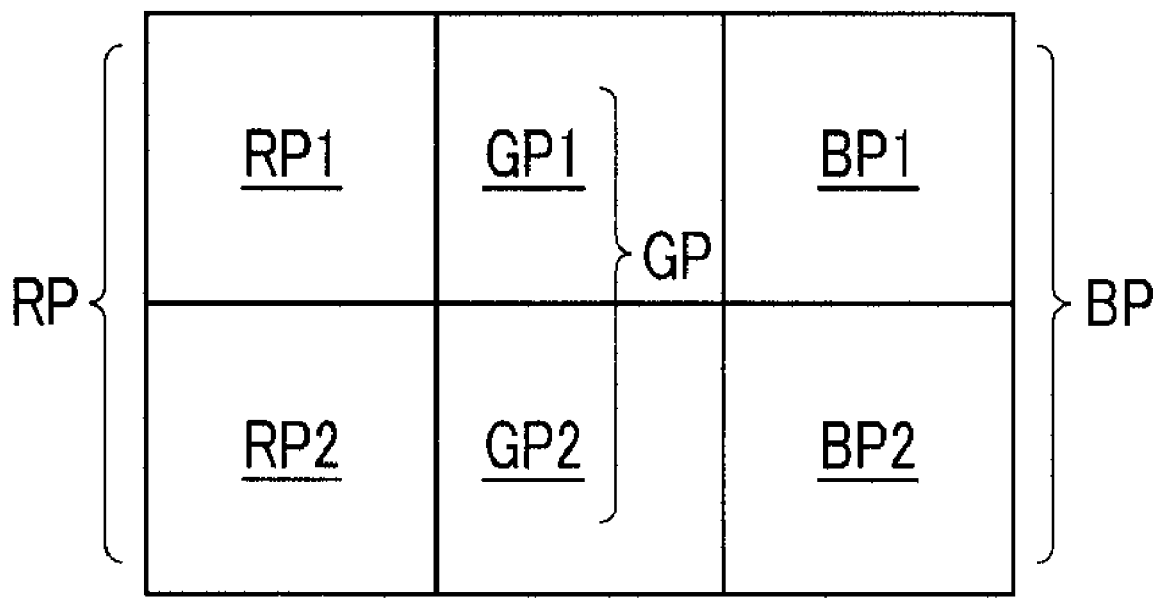
FIG. 9 is a drawing showing a pixel arrangement of an organic light emitting device in accordance with yet another exemplary embodiment.

FIG. 9 is a drawing showing a six subpixels arrangement (R1/R2, G1/G2, B1/B2) of an organic light emitting device in accordance with this yet another exemplary embodiment.

As shown in FIG. 9, the organic light emitting device in accordance with the present exemplary embodiment includes a red pixel area RP, a green pixel area GP, and a blue pixel area BP, and each of the respective pixel areas RP, GP, and BP includes two independently controllable and differently emitting subpixel units: RP1 and RP2, GP1 and GP2, and BP1 and BP2 having respective different color characteristics. For example, color coordinates in the gamut map (not shown) of red that the two subpixels RP1 and RP2 display may be different from each other, color coordinates of green that the two subpixels GP1 and GP2 display may be different from each other, and color coordinates of blue that the two subpixels BP1 and BP2 display may be different from each other.

In the pixel arrangement shown in FIG. 9, the red pixel area RP, the green pixel area GP, and the blue pixel area BP, which are each a rectangle with a width to length ratio of about 1:3, are arranged horizontally in a row. The subpixel units RP1, RP2, GP1, GP2, BP1, and BP2 of the respective pixel areas RP, GP, and BP have the same size and are arranged up and down as shown.

The cross-sectional structure of the organic light emitting device shown in FIG. 9 may be generally the same as that of the green pixel area GP shown in FIG. 3 combined with those of the red and blue pixel areas RP and BP shown in FIG. 6.

When each of the pixel areas RP, GP, and BP is respectively divided into two independently controllable subpixel units: RP1 and RP2, GP1 and GP2, and BP1 and BP2 having different color coordinates in accordance with the present exemplary embodiment, the range of colors that can be displayed is further increased.

In this way, it is possible to improve optical characteristics of the organic light emitting device and further increase the range of colors that can be displayed.

The concepts from present disclosure of invention may be applied to various types of organic light emitting devices.

While this disclosure describes what is presently considered to be practical exemplary embodiments, it is to be understood that the disclosure is not limited to the disclosed embodiments, but, on the contrary, is intended to cover various modifications and equivalent arrangements included within the spirit and scope of the disclosure.

What is claimed is:

1. An organic light emitting device comprising:
    a first pixel structured to output first light representing a first color to a viewer of the device;
    a second pixel disposed adjacent to the first pixel and structured to output second light representing a different second color to the viewer; and
    a third pixel disposed adjacent to the first pixel or the second pixel and structured to output third light representing a third color to the viewer, the represented third color being different than each of the represented first and second colors,
    wherein the first pixel comprises a first subpixel unit and a second subpixel unit respectively structured to emit respective lights having respective color characteristics which are different from one another, and wherein each of the first and second subpixel units has a multi-layered thin film structure, and the number of thin films in the first subpixel unit is greater than the number of thin films in the second subpixel unit.

2. The organic light emitting device of claim 1, wherein the different color characteristics of the lights respectively output by the first and second subpixels respectively define spaced apart regions of color coordinates on a color gamut map.

3. The organic light emitting device of claim 1, wherein the first subpixel unit comprises a first transflective electrode.

4. The organic light emitting device of claim 3, wherein
the second pixel has a multi-layered thin film structure including a second transflective electrode, and
the third pixel has a multi-layered thin film structure including a third transflective electrode.

5. The organic light emitting device of claim 4, wherein the number of thin films in each of the second and third pixels is the same as that of the number of thin films in the first subpixel unit.

6. The organic light emitting device of claim 5, wherein the first color is a green color, the second color is a red color, and the third color is a blue color.

7. The organic light emitting device of claim 3, wherein
the second pixel comprises a third subpixel unit and a fourth subpixel unit emitting lights having respectively different color characteristics defined as spaced apart color coordinates on a color gamut map,
each of the third and fourth subpixel units has a multi-layered thin film structure,
the number of thin films in the third subpixel unit is the same as the number of the thin films in the first subpixel unit,
the number of thin films in the fourth subpixel unit is the same as the number of the thin films in the second subpixel unit, and
the third subpixel unit comprises a second transflective electrode.

8. The organic light emitting device of claim 7, wherein
the third pixel area has a multi-layered thin film structure including a third transflective electrode.

9. The organic light emitting device of claim 8, wherein the number of thin films in the third pixel is the same as the number of the thin films in each of the first and third subpixel units.

10. The organic light emitting device of claim 9, wherein the first color is a red color, the second color is a blue color, and the third color is a green color.

11. The organic light emitting device of claim 7, wherein
the third pixel comprises a fifth subpixel unit and a sixth subpixel unit respectively emitting light having different color characteristics defined as spaced apart color coordinates on the color gamut map,
each of the fifth and sixth subpixel units has a multi-layered thin film structure,
the number of thin films in the fifth subpixel is the same as the number of thin films in each of the first and third subpixel units,
the number of thin films in the sixth subpixel unit is the same as the number of thin films in each of the second and fourth subpixel units, and
the fifth subpixel unit comprises a third transflective electrode.

12. An organic light emitting device comprising:
a thin film structure formed on a substrate;
first, second, and third transflective electrodes formed on the thin film structure;
a first transparent electrode formed on the first transflective electrode;
a second transparent electrode formed directly on the thin film structure
a third transparent electrode formed on the second transflective electrode;
a fourth transparent electrode formed on the third transflective electrode;
a first organic light emitting member formed on the first transparent electrode and structured to output in cooperation with the first transflective electrode, a first light representing a first color to a viewer of the device;
a second organic light emitting member formed on the second transparent electrode and structured to output a second light that is also representing the first color to the viewer;
a third organic light emitting member formed on the third transparent electrode and structured to output in cooperation with the second transflective electrode, a third light representing a different second color to the viewer;
a fourth organic light emitting member formed on the fourth transparent electrode and structured to output n cooperation with the third transflective electrode, a fourth light representing a third color to the viewer, where the represented third color is different from each of the represented first and second colors; and
a common electrode formed on the first to fourth organic light emitting members,
wherein the first and second lights respectively output to and viewable by the viewer have respective different color characteristics.

13. The organic light emitting device of claim 12, wherein the first color is a green color, the second color is a red color, and the third color is a blue color.

14. The organic light emitting device of claim 12, further comprising:
a fifth transparent electrode formed directly on the thin film structure; and
a fifth organic light emitting member formed on the fifth transparent electrode and capable of emitting a fifth light that is also representative of the second color.

15. The organic light emitting device of claim 14, wherein the first color is a red color, the second color is a blue color, and the third color is a green color.

16. The organic light emitting device of claim 14, further comprising:
a sixth transparent electrode formed directly on the thin film structure; and
a sixth organic light emitting member formed on the sixth transparent electrode and capable of emitting a sixth light that is also representative of the third color.

17. The organic light emitting device of claim 16, wherein the sixth transparent electrode has substantially the same voltage as the fourth transparent electrode.

18. The organic light emitting device of claim 14, wherein the fifth transparent electrode has substantially the same voltage as the third transparent electrode.

19. The organic light emitting device of claim 12, wherein the second transparent electrode has substantially the same voltage as the first transparent electrode.

* * * * *